United States Patent
Gough et al.

(10) Patent No.: US 7,145,943 B2
(45) Date of Patent: Dec. 5, 2006

(54) XDSL SYSTEM WITH IMPROVED IMPEDANCE CIRCUITRY

(75) Inventors: Gregory W. Gough, Wheaton, IL (US); Gregory L. Bella, Naperville, IL (US)

(73) Assignees: SBC Knowledge Ventures, L.P., Reno, NV (US); Westell Technologies, Inc., Aurora, IL (US)

( * ) Notice: Subject to any disclaimer, the term of this patent is extended or adjusted under 35 U.S.C. 154(b) by 506 days.

(21) Appl. No.: 10/647,817

(22) Filed: Aug. 25, 2003

(65) Prior Publication Data

US 2004/0037352 A1    Feb. 26, 2004

Related U.S. Application Data

(63) Continuation-in-part of application No. 09/750,406, filed on Dec. 28, 2000.

(60) Provisional application No. 60/177,925, filed on Jan. 25, 2000.

(51) Int. Cl.
*H04B 1/38*    (2006.01)
*H04L 5/16*    (2006.01)
*H04M 7/04*    (2006.01)

(52) U.S. Cl. ...................... 375/222; 379/398

(58) Field of Classification Search ............... 375/222; 379/394, 398, 403; 370/282
See application file for complete search history.

(56) References Cited

U.S. PATENT DOCUMENTS

| | | | | |
|---|---|---|---|---|
| 3,919,502 A | * | 11/1975 | Daryanani | ................. 379/403 |
| 4,096,361 A | * | 6/1978 | Crawford | ................... 379/403 |
| 4,096,362 A | * | 6/1978 | Crawford | ................... 379/403 |
| 6,208,732 B1 | * | 3/2001 | Moschytz et al. | .......... 379/402 |
| 6,298,046 B1 | * | 10/2001 | Thiele | ........................ 370/282 |
| 6,542,604 B1 | * | 4/2003 | Blon et al. | .................. 379/398 |
| 6,724,890 B1 | * | 4/2004 | Bareis | ........................ 379/394 |

FOREIGN PATENT DOCUMENTS

| | | |
|---|---|---|
| EP | 0 806 852 A2 | 11/1997 |
| EP | 0 820 168 A2 | 1/1998 |
| EP | 0 828 363 A2 | 3/1998 |
| EP | 0 831 624 A2 | 3/1998 |

* cited by examiner

*Primary Examiner*—Emmanuel Bayard
*Assistant Examiner*—Lawrence Williams
(74) *Attorney, Agent, or Firm*—Toler Schaffer, LLP

(57) ABSTRACT

An XDSL system comprising a hybrid circuit in operative communication with a transmission line and an XDSL modem associated with a subscriber premises. The hybrid circuit comprises a plurality of selectable impedance circuits having different impedance values. A controller selectively engages each of the impedance circuits in-line with the XDSL modem and the transmission line. The controller records the performance of the modem with each circuit engaged, and selects the desired impedance circuit as a function of the performance characteristics associated with each of the impedance circuits. The impedance circuit which provides the best performance characteristic is selected as the impedance circuit for normal modem operation.

20 Claims, 5 Drawing Sheets

XDSL SYSTEM WITH IMPROVED IMPEDANCE CIRCUITRY

RELATED APPLICATIONS

This application is a Continuation-In-Part of U.S. patent application Ser. No. 09/750,406, filed Dec. 28, 2000 and titled "XDSL System Having Selectable Hybrid Circuitry," hereby incorporated by reference, which claims the benefit of U.S. Provisional Application No. 60/177,925 entitled "XDSL System Having Selectable Hybrid Circuitry" filed Jan. 25, 2000, hereby incorporated by reference.

FIELD OF THE INVENTION

The present invention relates to data transmission systems, and more particularly, improved impedance circuitry for XDSL transmission systems.

BACKGROUND OF THE INVENTION

Digital Subscriber Line (DSL) is a technology which allows for simultaneous voice and data traffic to coexist over a communication channel comprising a standard telephone transmission line. Typically, the standard telephone transmission line comprises an unshielded twisted-pair of copper wire having a gage of 22–26 AWG. Twisted pairs, which can be used to connect a central telephone system to a subscriber's telephone system can support bandwidths up to 2 MHz through the use of digital signal processing (DSP) technology. Thus, they can be used for bandwidth-intensive applications, such as Internet access and video-on demand, as well as for carrying voice traffic. Frequency division multiplexing is used so that the plurality of signals, each occupying a different frequency band, can be simultaneously sent over the same transmission line.

Because there are different varieties of digital subscriber line technology, it is sometimes generally referred to as XDSL wherein the "X" refers to a specific DSL standard such as HDSL for high bit rate digital subscriber line or RADSL for rate adaptive digital subscriber line, etc. As the name implies, ADSL is asymmetric in that the data transmission rates differ in the upstream and downstream direction. In the context of a phone system, the downstream direction is defined as transmissions from the central office to a remote location that may be an end user such as a residence or business. The reverse signal corresponds to transmissions in an upstream direction, i.e., from the remote location to the central office. ADSL data traffic bandwidth for CAP (carrier-less amplitude and phase) modulation is typically from about 35 kHz to 1.5 MHz. The bandwidth for ADSL data traffic using DMT (discreet multi-tone modulation) is from approximately 25 kHz to 1.5 MHz. A hybrid circuit is typically used in DSL systems to separate the upstream (transmit) and downstream (receive) signals on the twisted-pair transmission line.

Referring now to FIG. 1 there is shown an example of a typical analog front end of an ADSL remote unit (ATU-R). The hybrid circuitry 2 separates the signals received on the two-wire transmission line 4 into respective upstream and downstream communication channels. The upstream communication channel occupies a bandwidth from about 30 kHz to 138 kHz as represented by the band pass filter 6. The downstream communication channel occupies a bandwidth from approximately 170 kHz and upward as represented by the high pass filter 8. In such cases, the upstream and downstream frequency arranges are only separated by 32 kHz. Accordingly, it is very important that the impedance of the hybrid 2 matches the impedance of the transmission line 4 to prevent reflections which can significantly degrade performance, particularly in the downstream direction. This can occur when high upstream signal power in the 138 kHz range is reflected back through a poor hybrid match of the transmission line into the downstream path thereby interfering with downstream signal recovery. Current ADSL modem implementations use only one impedance value for the hybrid circuit 2 which is specifically tuned to a characteristic line impedance of 100 ohms.

As a practical matter, however, the impedance of the transmission line is rarely 100 ohms due to line conditions such as bridge taps. A bridge tap is a non-terminated copper pair cable connected in parallel to the subscriber line. While a bridge tap has no effect on POTS service, it can significantly alter the impedance of the transmission line thereby creating an impedance mismatch with existing ADSL modem hybrids.

Thus, there exists a need for an XDSL system having improved impedance circuitry or impedance matching circuitry which better matches the particular subscriber transmission line impedance.

BRIEF DESCRIPTION OF THE DRAWINGS

For a more complete understanding of this invention, reference should now be made to the embodiments illustrated in greater detail in the accompanying drawings and described below by way of examples of the invention.

In the drawings.

DETAILED DESCRIPTION

Broadly speaking, the invention includes selectable hybrid circuitry for an XDSL modem system wherein each hybrid circuit has a different termination impedance. Upon initialization, the XDSL modem synchronizes with the different hybrid circuits and records the upstream and downstream performance for each hybrid. After the initialization sequence is complete, the modem performs a final synchronization corresponding with the best performing hybrid circuit.

Figure 1:
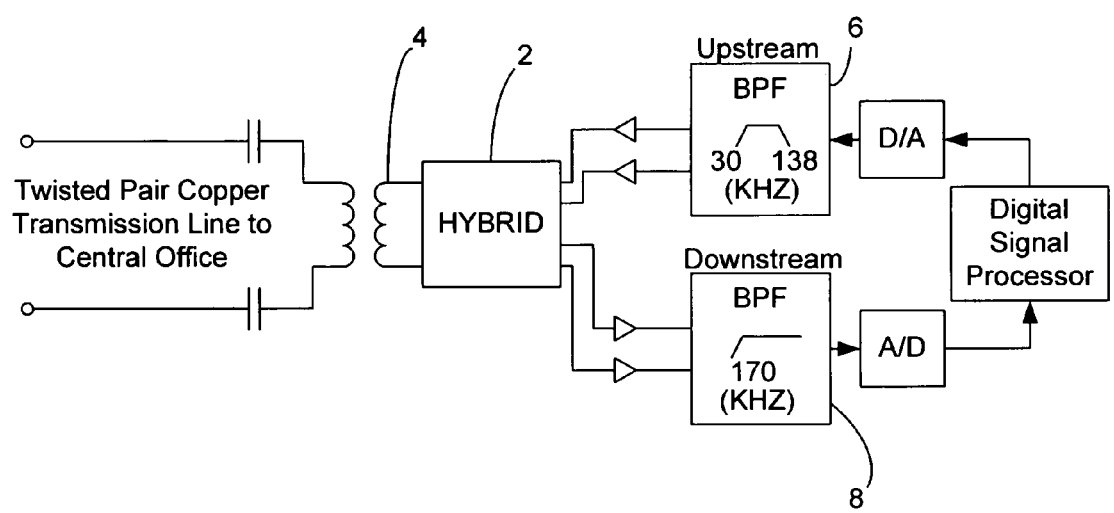
FIG. 1 is a block diagram of an XDSL system incorporating a hybrid circuitry according to the prior art.
Figure 2:
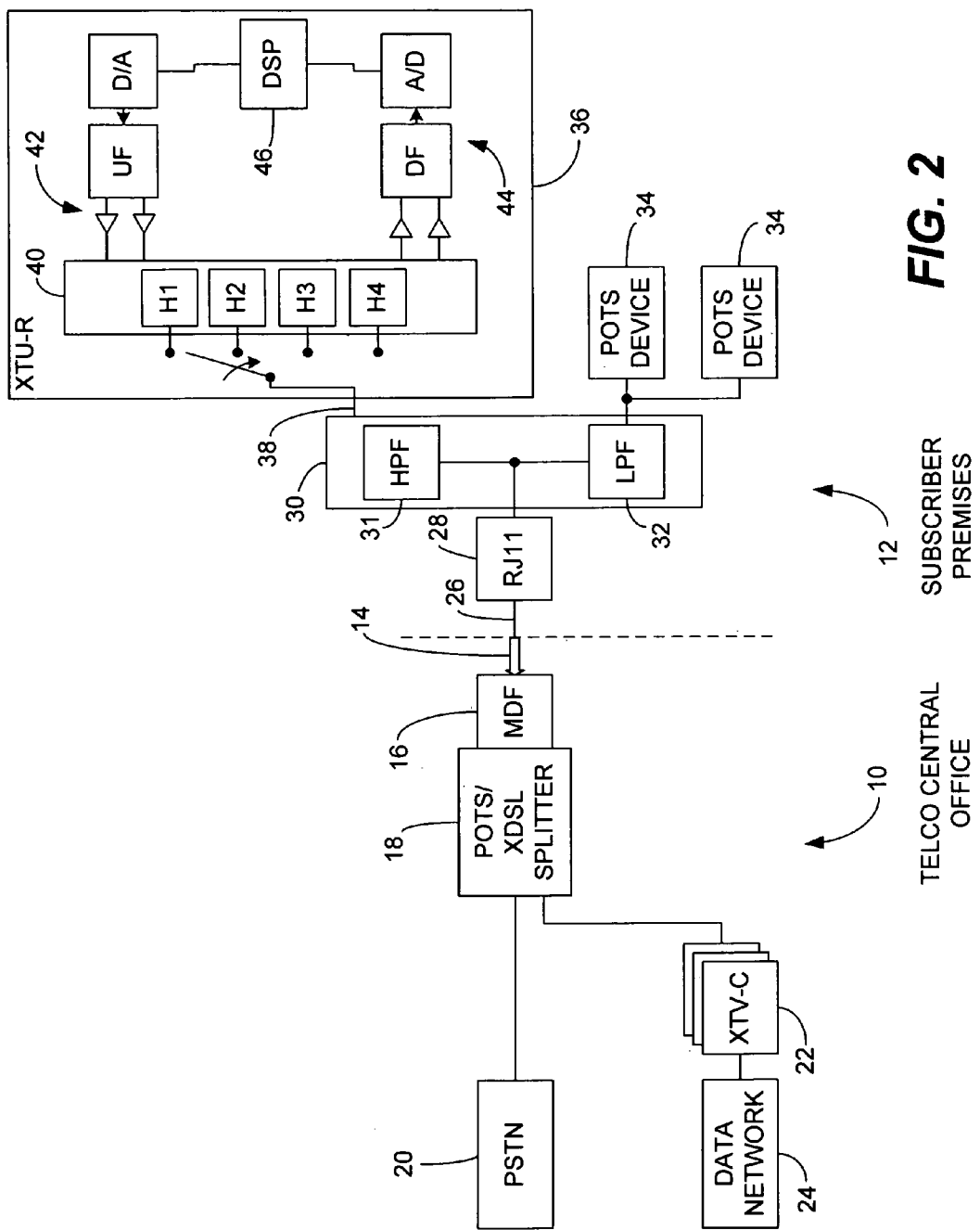
FIG. 2 is a block diagram of an XDSL system incorporating selectable hybrid circuitry according to one embodiment of the present invention.

Referring now to FIG. 2, there is shown a block diagram of an XDSL system incorporating selectable hybrid circuitry according to one embodiment of the present invention. The diagram of FIG. 2 is divided into two portions; one of which represents the telco central office 10 and the other which represents the subscriber premises 12. Communication channel 14 represents the main feeder cables to the telco outside plant. These cables interface with the main distribution frame (MDF) 16 within a central office 10. A splitter 18 divides the plain old telephone service (POTS) signals from the higher frequency XDSL signals. The POTS signals are routed through the central office switch to the worldwide public switched telephone network 20. The XDSL signals are routed to a plurality of XDSL transceiver units at the central office (XTU-C) 22 each of which corresponds to a respective XDSL transceiver unit remotely located (ATU-R) at a subscriber premises. The XTU-Cs 22 connect through the central office XDSL subscriber loop and data network interface to access the Internet ISP and other data networks 24.

At least a portion of the communication channel that connects the central office 10 with the subscribed premises 12 comprises a twisted-pair subscriber loop 26. The frequency bands transmitted along the twisted-pair subscriber loop 26 between a central office 10 and a subscriber premises 12 include the low frequency POTS band, the higher frequency upstream data communications band and the higher frequency downstream data communication band. The twisted-pair subscriber loop 26 connects to the subscriber premises through a standard RJ-11 modular connector 28. A splitter 30 comprising a high-pass filter 31 and a low-pass filter 32 may also be included at the subscriber premises to divide the higher frequency data communication bands from the lower frequency POTS communication band. The POTS signals are then transmitted to POTS devices 34 such as a telephone or facsimile machine. The higher frequency data signals are communicated to the XTU-R 36. Of course, in a splitter-less XDSL configuration, the splitter 30 would not be necessary and the XTU-R 36 would incorporate a device for filtering out the POTS band communication signals.

The XTU-R 36 comprises the selectable hybrid circuitry 40 which includes preferably four hybrid circuits H1 H2 H3 H4. In accordance with the control scheme described below, the hybrid circuit having the closest matching impedance to the two wire transmission line 38 is selected to be included in the transmission path. The output of the hybrid circuitry 40 separates the transmit and receive signals into an upstream data path 42 and downstream data path 44. The selection control of the hybrid circuitry 40 preferably implemented as firmware executed by the XTU-R controller which comprises a microprocessor or a digital signal processor 46.

Figure 3:
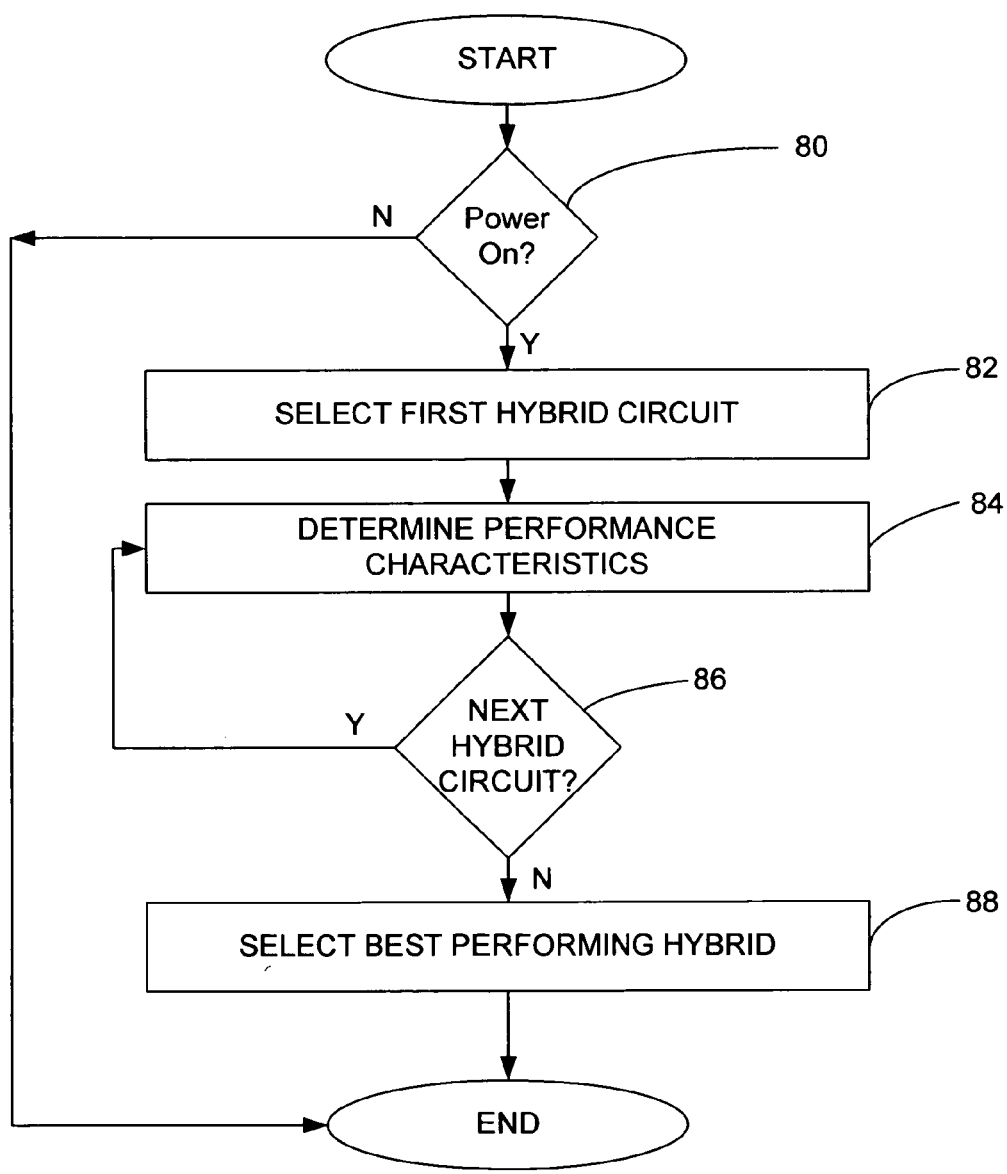
FIG. 3 is a logic flow diagram of one method of controlling the selectable hybrid circuitry of FIG. 2.

Referring now to FIG. 3, there is shown a logic flow diagram of one method of controlling the selectable hybrid circuitry 40 of FIG. 2. The logic begins in step 80 when the XTU-R modem is power cycled. Upon power-up, the logic enters a training routine to select the hybrid circuit characteristics which provide the best transmission performance. Thus, in step 82, the first hybrid circuit H1 is selected. In step 84, the performance characteristics of the communication channel is determined utilizing the first hybrid circuit. The performance characteristics selected for analysis can be any known performance characteristic such as the downstream data rate, upstream data rate, the line attenuation, and the noise margin. The desired performance characteristics are then saved for later comparison with the performance characteristics of the remaining hybrid circuit configurations.

In step 86, the next hybrid circuit is selected such as, for example, H2 of FIG. 2. The line performance characteristics are then determined using hybrid circuit H2. This continues until all of the hybrid circuit configurations within the selectable hybrid 40 are exhausted. Alternatively, if the determined performance characteristics of, for example, the first hybrid circuit, exceed a predetermined threshold line characteristic, no further hybrid circuit configurations need be tested. The logic then continues to step 88 wherein the hybrid circuit configuration having the best performance as determined by the selected performance criteria is selected as the configuration for all subsequent transmissions. Again, alternatively, if during the testing phase, a hybrid circuit configuration exceeds a predetermined line performance, that hybrid circuit configuration under consideration can be selected as the hybrid circuit configuration for all subsequent transmissions.

Preferably, the performance and selection analysis is performed only when the modem is power cycled. In this way, any disturbances that cause a retrain such as a line disconnect, will not result in a hybrid selection change.

Figure 4:
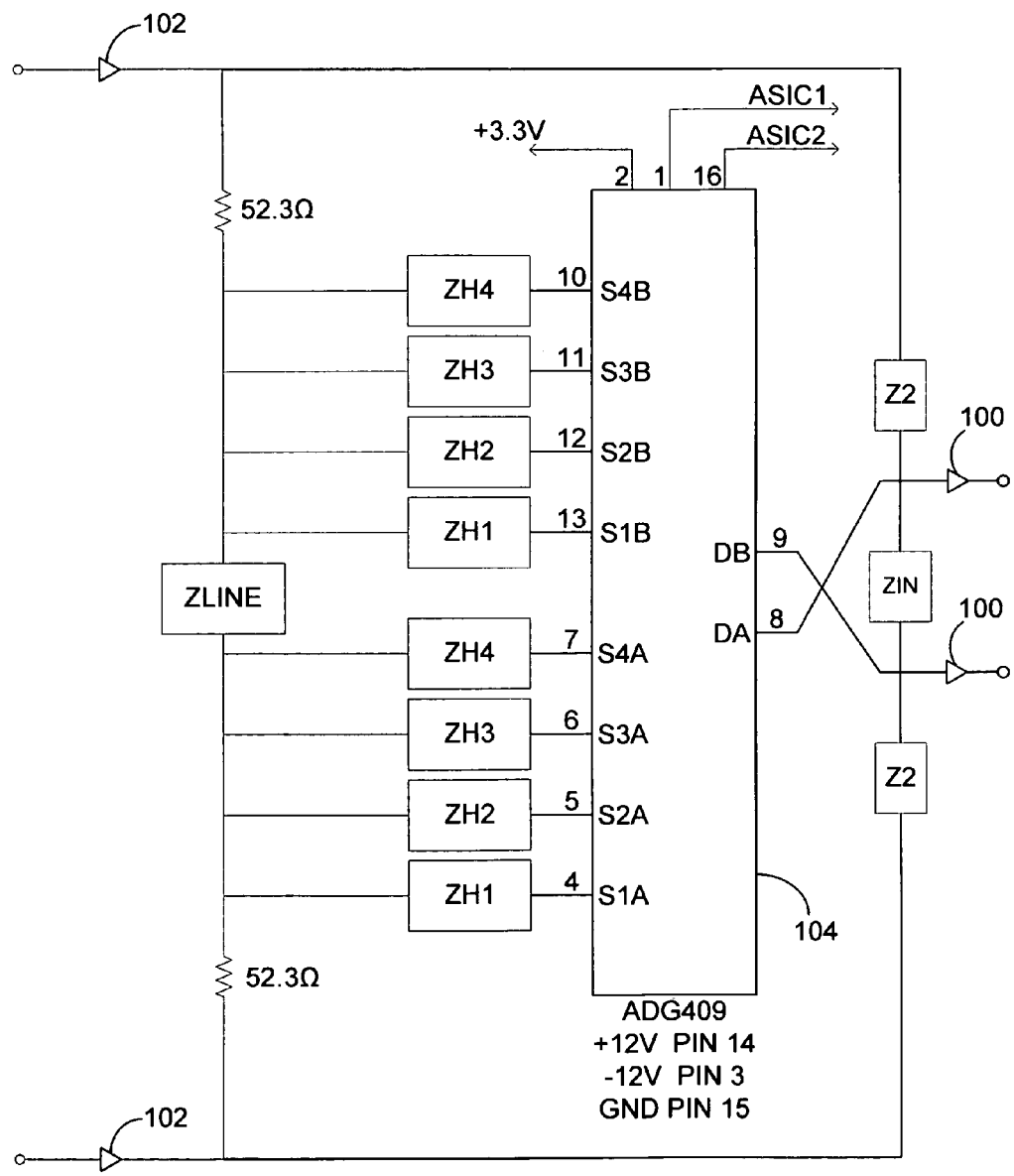
FIG. 4 is a block diagram of an XDSL system incorporating selectable hybrid circuitry according to another embodiment of the present invention.

Referring now to FIG. 4, there is shown a selectable hybrid circuit according to another embodiment of the present invention. The configuration shown in FIG. 4 is an analog front end topology which supports an Alcatel chip set, analog front end for an ADSL receiver unit. For such a configuration, Z2 represents an impedance equal to 787 ohms+100 nF. ZIN represents the input impedance of the downstream receive path high pass filter. Drivers 100 are receive path downstream drivers. ZLINE represents the input impedance of the two wire transmission line. Drivers 102 represent the transmit path upstream drivers.

The hybrid circuitry comprises an analog switch 104 and corresponding plurality of impedance values ZH1, ZH2, ZH3, ZH4. Preferably, the switch 104 is an analog switch such as model number ADG4O9 available from Analog Devices, Inc. The ADG4O9 switch has a resistance of approximately 40 ohms, and this must be taken into account when selecting the corresponding hybrid impedances ZH1 through ZH4. ASIC1 and ASIC2 are binary select lines for the switch 104. These binary select lines are controlled by the processor which cycles through a binary count on successive hybrid circuit selections and performance determinations to select the best hybrid circuit configuration.

Preferably, the values for ZH1 through ZH4 are selected to provide the closest impedance match to the most common impedance characteristics of subscriber loops. As described above, bridge taps are found commonly within the public switch telephone network. According to studies, approximately 75% of all subscriber loops have some type of bridge tap, and approximately 33% of all loops have bridge taps between 250 and 500 feet from the subscriber premises. The existence of bridge taps can significantly alter the impedance characteristics of the subscriber loop. For example, a 15 kFT, 26 AWG cable without a bridge tap exhibits an input impedance of 118 ohms at 200 kHz. With a 350 ft bridge tap, however, the impedance changes to 71 ohms. This represents a nearly 40% impedance change. With the assumptions shown in FIG. 4 for the Alcatel chip set and the ADG 409 switch, the preferred values for ZH1 through ZH4 are as follows:

$$ZH1=750\Omega//(525\Omega+2000\ pF).$$

This value for ZH1 best matches an 8 to 20 kft 24/26 AWG cable with a 350 ft bridge tap.

Preferably, the value of ZH2 is 620Ω//(320Ω+4200 pF). This value of ZH2 best matches the impedance characteristics of a 12–15 kft, 26 AWG cable with a 350 ft bridge tap.

Preferably, the value of ZH3 is 460Ω//(1200Ω+520 pF). This value of ZH3 best matches a 24/26 AWG cable without bridge taps.

Finally, the preferred value of ZH4 is 620Ω//(680Ω+2200 pF). This value for ZH4 represents a compromise impedance, which combines characteristics of the other three impedance values.

Figure 5:
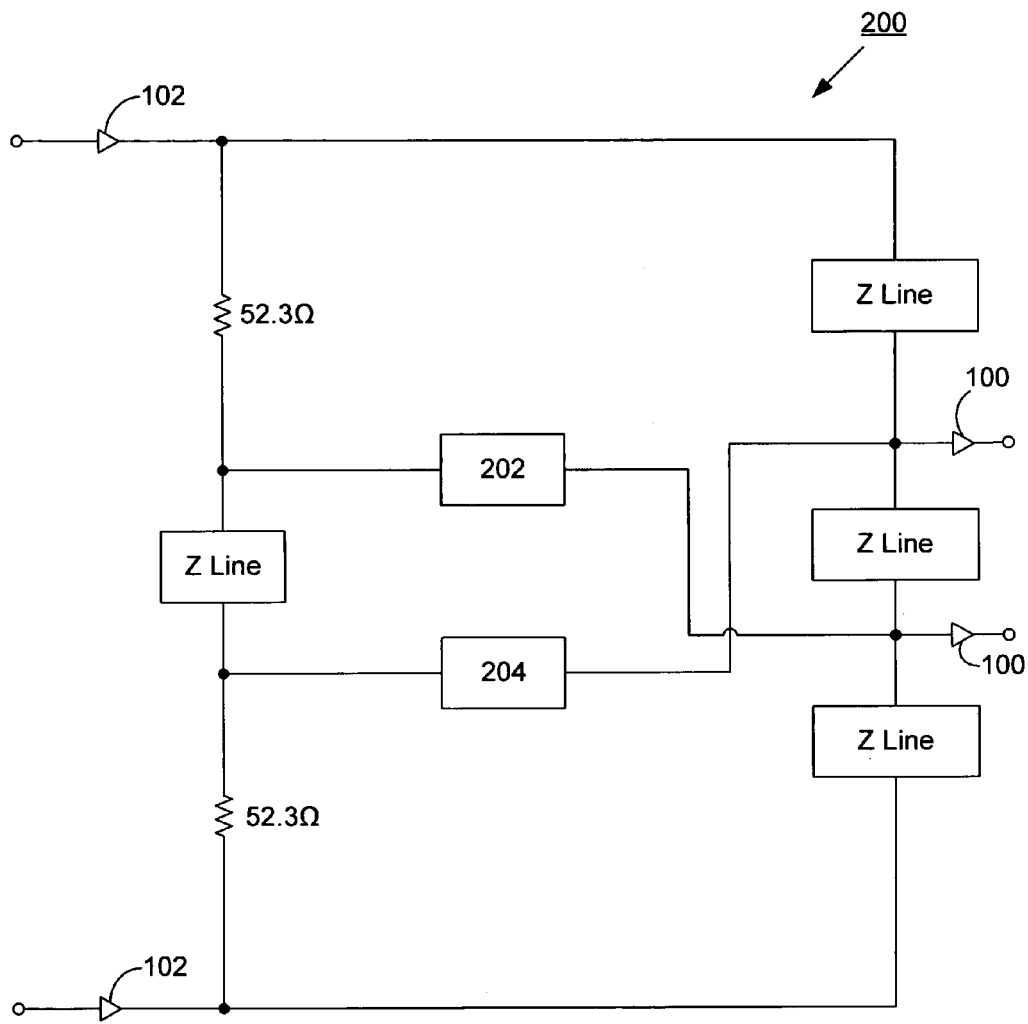
FIG. 5 is a block diagram of an improved impedance circuit utilizing a compromise impedance.

An alternative impedance matching circuit 200 is shown in FIG. 5. The circuit 200 includes first and second fixed impedances 202, 204. Each of the impedances 202, 204 also has a value that is a compromise to allow satisfactory performance, regardless of the line impedance presented to the circuit 200. In one embodiment shown in FIG. 5, the impedances 202, 204 each have a value approximately equal to 620Ω//(680Ω+2200 pF). Of course, this value may vary, depending on a variety of circuit variables, such as the presence or absence of bridge taps on the transmission line, the physical length of the transmission line, etc.

Thus, the invention of FIG. 5 does not include either a switch or controller, nor a variety of selectable impedances. Accordingly, the invention is less complex and less expensive to manufacture. Moreover, the circuit 200 allows for quicker initialization, since the device need not test a plurality of different impedances during set up. Consequently, a customer using a computer need not wait as long initially before her or his computer begins transmitting and receiving data over the transmission line.

Of course, the number of hybrid circuit configurations shown and the value of each corresponding impedance is merely exemplary. It should be understood that more or less than four hybrid circuit configurations are possible and that each circuit configuration can have a different impedance value. The more circuit configurations implemented for a selectable hybrid design, however, the slower the analysis upon power-up since the performance of each hybrid configuration is tested to select the best performing hybrid configuration.

From the foregoing, it can seen that there has been brought to the art a new and improved selectable hybrid circuit for use in an XDSL system which provides improved performance by more closely matching the impedance characteristics of the twisted-pair subscriber loop. While the invention has been described in connection with one or more embodiments, it should be understood that the invention is not limited to those embodiments. On the contrary, the invention covers all alternatives, modifications, and equivalence, as may be included within the spirit and scope of the appended claims.

We claim:

1. An XDSL system comprising:
an impedance matching circuit in operative communication with a transmission line and an XDSL modem associated with a subscriber premises, the impedance matching circuit including a fixed impedance having a compromise impedance providing a substantial impedance match to a plurality of common impedance characteristics of copper transmission lines,
wherein the impedance matching circuit provides the substantial impedance match without testing different impedances.

2. The XDSL system of claim 1, wherein the compromise impedance comprises a resistance of approximately 620 ohms in parallel with a series combination of a resistor of approximately 680 ohms and a capacitor of about 2200 picofarads.

3. The XDSL system of claim 1, wherein the compromise impedance has an impedance value that is approximately equal to a characteristic line impedance of the transmission line without a bridge tap.

4. The XDSL system of claim 1, wherein the compromise impedance has an impedance value that is approximately equal to a characteristic line impedance of the transmission line with a bridge tap.

5. An impedance matching circuit responsive to a transmission line and to a modem to provide an approximate impedance match to an impedance of the transmission line, the impedance matching circuit comprising:
a first fixed impedance including a first compromise value; and
a second fixed impedance including a second compromise value;
wherein at least one of the first compromise value and the second compromise value comprises an impedance value that relates to a combination of characteristics of transmission lines with and without bridge taps.

6. The impedance matching circuit of claim 5, wherein the first compromise value and the second compromise value are approximately equal.

7. The impedance matching circuit of claim 5, wherein the first compromise value comprises a value approximately equal to $620\Omega//(620\Omega+2200\text{ pF})$.

8. The impedance matching circuit of claim 5, wherein the first fixed impedance and the second fixed impedance provide an approximate impedance match to a transmission line without testing impedances during setup.

9. The impedance matching circuit of claim 5, wherein a value of the first fixed impedance varies responsive to a characteristic of the transmission line.

10. The impedance matching circuit of claim 9, wherein the characteristics of the transmission line comprises a physical length of the transmission line.

11. The impedance matching circuit of claim 9, wherein the characteristics of the transmission line comprises a line impedance of the transmission line with a bridge tap.

12. The impedance matching circuit of claim 9, wherein the characteristics of the transmission line comprises a line impedance of the transmission line without a bridge tap.

13. A method comprising:
applying an impedance matching circuit to a transmission line, the impedance matching circuit responsive to the transmission line and to a modem that is associated with a subscriber premises, the impedance matching circuit including a first fixed impedance having a first compromise impedance and a second fixed impedance having a second compromise impedance;
approximating a line impedance of the transmission line using the first fixed impedance and the second fixed impedance to provide a compromise impedance match to the line impedance; and
wherein the impedance matching circuit provides the compromise impedance match without testing different impedances.

14. The method of claim 13, wherein at least one of the first compromise impedance and the second compromise impedance comprises an impedance value that relates to a combination of characteristics of transmission lines with and without bridge taps.

15. The method of claim 13, wherein the first compromise impedance and the second compromise impedance are approximately equal.

16. The method of claim 13, wherein the first compromise impedance comprises a value approximately equal to $620\Omega//(620\Omega+2200\text{ pF})$.

17. The method of claim 13, wherein a value of the first fixed impedance varies responsive to a characteristic of the transmission line.

18. The method of claim 17, wherein the characteristic of the transmission line comprises a physical length of the transmission line.

19. The method of claim 17, wherein the characteristic of the transmission line comprises a line impedance of the transmission line with a bridge tap.

20. The method of claim 17, wherein the characteristic of the transmission line comprises a line impedance of the transmission line without a bridge tap.

* * * * *